United States Patent
Maly

(10) Patent No.: US 8,098,491 B2
(45) Date of Patent: Jan. 17, 2012

(54) CONTROL UNIT FOR CONTROLLING AN ELECTROMOTIVE DRIVE UNIT

(75) Inventor: Heinrich Maly, Kottingbrunn (AT)

(73) Assignee: Continental Automotive GmbH, Hannover (DE)

( * ) Notice: Subject to any disclaimer, the term of this patent is extended or adjusted under 35 U.S.C. 154(b) by 534 days.

(21) Appl. No.: 12/303,390

(22) PCT Filed: Oct. 16, 2007

(86) PCT No.: PCT/EP2007/061040
§ 371 (c)(1),
(2), (4) Date: Dec. 4, 2008

(87) PCT Pub. No.: WO2008/046832
PCT Pub. Date: Apr. 24, 2008

(65) Prior Publication Data
US 2009/0190315 A1     Jul. 30, 2009

(30) Foreign Application Priority Data

Oct. 20, 2006   (DE) .......................... 10 2006 049 635

(51) Int. Cl.
*H05K 7/00*    (2006.01)
(52) U.S. Cl. .................................... 361/728; 361/679.01
(58) Field of Classification Search .................. 361/728, 361/679.01
See application file for complete search history.

(56) References Cited

U.S. PATENT DOCUMENTS

| | | | |
|---|---|---|---|
| 6,107,713 A | 8/2000 | Hülsmann et al. | 310/75 R |
| 6,466,451 B2 * | 10/2002 | Mizuno et al. | 361/796 |
| 6,709,291 B1 | 3/2004 | Wallace et al. | 439/607 |
| 6,790,050 B1 * | 9/2004 | Roth-Stielow et al. | 439/76.2 |
| 7,091,692 B2 * | 8/2006 | Ctvrtnicek et al. | 318/806 |

FOREIGN PATENT DOCUMENTS

| | | |
|---|---|---|
| DE | 4439471 A1 | 5/1996 |
| DE | 19851455 | 8/1999 |
| DE | 19839333 | 1/2000 |
| DE | 19839333 C1 | 1/2000 |
| DE | 19926639 C1 | 5/2001 |
| DE | 10127652 | 1/2002 |
| DE | 10108414 | 9/2002 |
| DE | 10141246 C1 | 4/2003 |
| DE | 202004015409 | 2/2006 |
| DE | 102005007931 A1 | 8/2006 |
| EP | 0359606 A1 | 3/1990 |

OTHER PUBLICATIONS

International Search Report and Written Opinion; PCT/EP2007/061040; pp. 12, Jul. 25, 2008.

\* cited by examiner

*Primary Examiner* — Hien Vu
(74) *Attorney, Agent, or Firm* — King & Spalding L.L.P.

(57) ABSTRACT

A control unit for controlling an electromotive drive unit has a housing (16), which can be connected to the drive unit by a mechanical interface device, and a plug-in device (17) provided on the housing, for plugging in a cable (20) that is guided to the hosing from the outside, wherein contact pins (6) of the plug-in device are arranged in at least one slot (18) of the plug-in device (17) and are electrically connected to conductor tracks of a circuit board (8), which is arranged on the inside of the housing. The at least one slot (18) is arranged on the side (7) of the housing (16) facing away from the drive unit and is formed by a connector collar (5), which is configured as one piece with the housing (16) and made of the same polymer material.

18 Claims, 4 Drawing Sheets

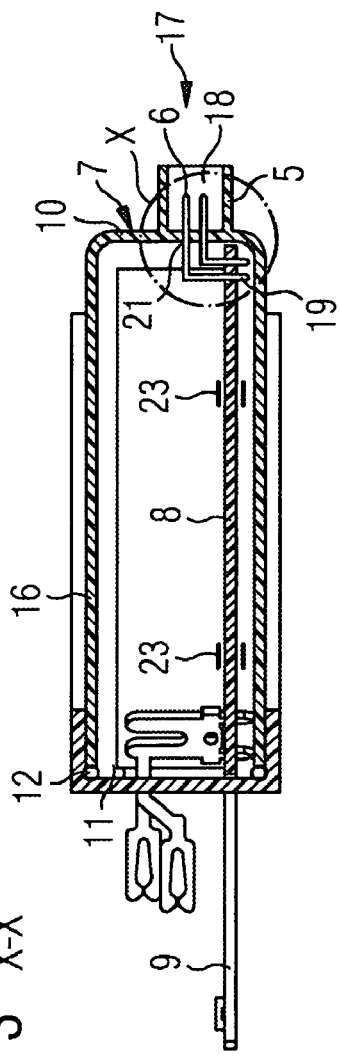
FIG 3 X-X
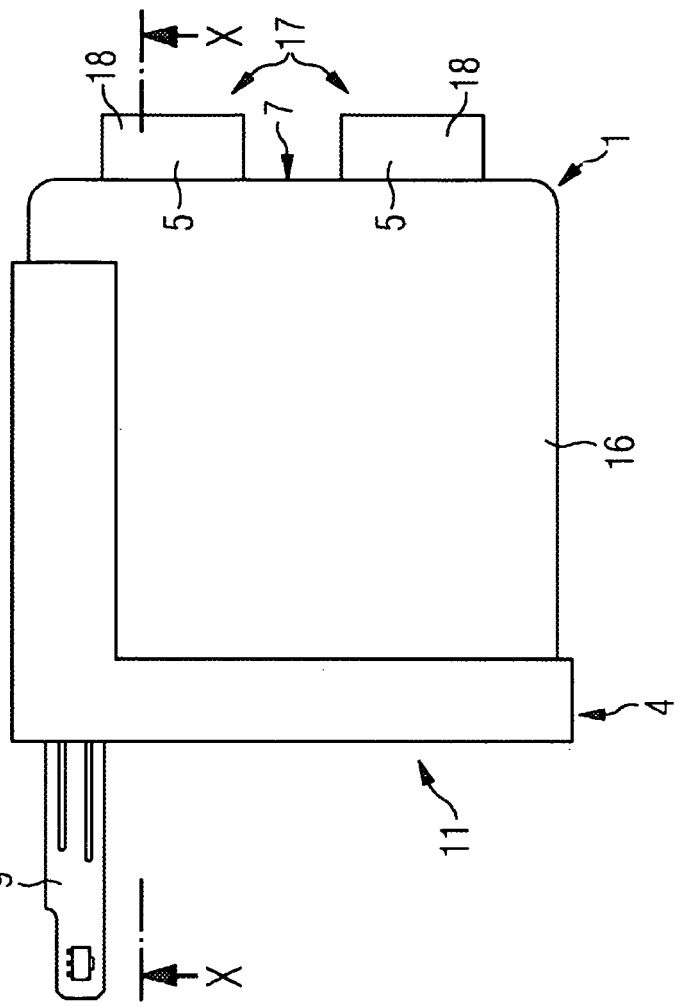
FIG 2
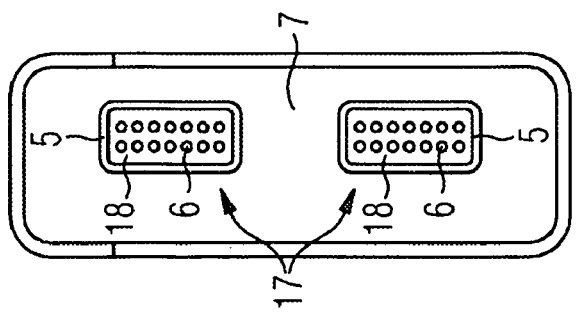
FIG 4

CONTROL UNIT FOR CONTROLLING AN ELECTROMOTIVE DRIVE UNIT

CROSS-REFERENCE TO RELATED APPLICATIONS

This application is a U.S. National Stage Application of International Application No. PCT/EP2007/061040 filed Oct. 16, 2007, which designates the United States of America, and claims priority to German Application No. 10 2006 049 635.3 filed Oct. 20, 2006, the contents of which are hereby incorporated by reference in their entirety.

TECHNICAL FIELD

The invention relates to a control unit for controlling an electromotive drive unit, comprising a housing which can be connected to the drive unit by means of a mechanical interface device, and comprising a plug-in device formed on the housing for plugging in a cable that is guided to the housing from the outside, wherein the plug-in device comprises at least one connector slot in which contact pins are arranged which are electrically connected with conductor tracks of a circuit board arranged in the housing.

BACKGROUND

A drive unit for an electric window lifter in a vehicle door is described from DE 101 41 246 C1 which can be mechanically and electrically connected with a control unit by means of a mechanical interface device. The control unit comprises a cuboid-shaped housing formed of two half shells. On a side of the housing facing the outside of the door or into the passenger compartment a plug-in device is provided which serves for the connection of a cable through which the control unit is connected to a motor vehicle battery or to control lines of a motor vehicle bus. The multi-part embodiment of the housing, wherein the plug-in device often forms a separate connector component inserted in an indentation is expensive to manufacture. The lateral arrangement of the plug-in device is a disadvantage since the installation space available in the vehicle door is narrowly confined. The multi-part housing is not waterproof; it can only be inserted in the dry side of the door.

SUMMARY

According to various embodiments, a control unit can be designed which is easier to manufacture and which has a lesser installation depth in the direction of the door width.

According to an embodiment, a control unit for controlling an electromotive drive unit, may comprise a housing that can be connected with a drive unit by means of a mechanical interface device and a plug-in device formed on the housing for plugging-in a cable that is guided to the housing from the outside, wherein contact pins of the plug-in device are arranged in at least one connector slot of the plug-in device and are electrically connected with conductor tracks of a circuit board which is arranged in the interior of the housing, wherein the at least one connector slot is arranged on a side of the housing facing away from the drive device and is formed by a connector collar which is formed as one piece with the housing and of the same polymer material.

According to a further embodiment, the housing may be formed in the shape of a cuboid cup and comprises a floor part onto which the at least one connector collar is molded on the outside of the housing. According to a further embodiment, in the housing a guiding device can be arranged by means of which the circuit board can be plugged into the housing in the direction of the floor part from an opening, wherein in the floor part in the region of the at least one connector slot plug-through openings are provided through which the contact pins, which, with an end are fastened to the circuit board and with another end are orientated parallel to the plane of the circuit board in plug-in direction, can be plugged through. According to a further embodiment, the plug-through openings seen in plug-in direction can be formed conically tapering. According to a further embodiment, the contact pins can be formed as 90° angled-off cylindrical contact pins or prismatic contact posts. According to a further embodiment, each plug-through opening may be formed through a conical bore with a clear diameter which is greater than a diameter of the contact pins or a cross sectional diagonal of the contact posts. According to a further embodiment, the contact pins or contact posts may be manufactured of bronze. According to a further embodiment, the contact pins or contact posts may be fastened to the circuit board by means of a soldered connection or a pressing-in connection. According to a further embodiment, the guiding device may be formed through guide strips or slot-shaped clearances which are formed on opposite inner wall faces of the narrow sides of the housing. According to a further embodiment, on a side located towards the drive of the housing a sealing device can be provided. According to a further embodiment, on the side of the housing facing away from the drive at least two connector collars may be formed.

BRIEF DESCRIPTION OF THE DRAWINGS

To further explain the invention reference is made to the drawings in the following part of the description in which further advantageous embodiments, details an d further developments of the invention are shown.

FIG. 2 a top view of the control unit of FIG. 1 according to an embodiment;

FIG. 3 a cut representation of the control unit according to an embodiment along the line X-X of FIG. 2;

FIG. 4 a lateral view with view of the floor part of the housing;

DETAILED DESCRIPTION

The control unit according to an embodiment is characterized in that the plug-in device is arranged on a side of the housing facing away from the drive device and that the connector slot is formed by at least one connector collar which is configured in one piece and the same polymer material as the housing. Through the arrangement of the plug-in device according to an embodiment the lateral size of the control unit is reduced. The use of the control unit is also possible in vehicle doors having a small door width. The housing can be manufactured of plastic through injection molding, wherein only a single injection mold is required.

Preferred may be a housing design in form of a cuboid-shaped cup wherein the plug-in device is arranged on the floor part of the cup.

In a further embodiment it can be provided that in the interior of the housing a guiding device is formed in which the circuit board can be inserted from an opening of the cup-shaped housing in the direction of the floor part. The floor part comprises plug-through openings in the region of the connector slot or slots. These plug-through openings are so dimensioned that plug contacts which are fastened to the circuit board with an end, can be plugged through with an end that is bent parallel to the plane of the circuit board in plug-in direction. As a result, no expensive installation tools which were required for a plug-in device formed as separate part are required. Advantageously the plug-through openings seen in plug-in direction are formed conically tapering. This makes the threading-in of the plug contacts easier. Preferred in this context may be a clear diameter of the plug-through opening which is greater than a contact diameter or a cross sectional diagonal of a contact post.

It may be practical if the plug contacts are formed as contact pins angled-off at 90°.

The connector pins or connector posts may be preferably made of bronze wherein the molding-on of an elastic pressing-in zone for pressing into a bore of the circuit board is favorable.

The connector pins or connector posts can preferably be fastened to the circuit board either by a material-joined soldered connection or by a friction-joined connection, e.g. by a pressing-in connection. Both connecting techniques are familiar to the person skilled in the art.

Preferred can be an embodiment of the guide elements which consist of strips or slot-shaped depressions which are formed on opposite narrow sides in the interior of the housing running in parallel in the direction of the floor part.

Advantageously the embodiment of the housing according to a further embodiment can be rendered waterproof through a sealing device arranged on a motor side and a connector side. Thus dirt particles and moisture are kept away from the circuit on the board; use in the wet region of the motor vehicle door is also possible.

Figure 1:
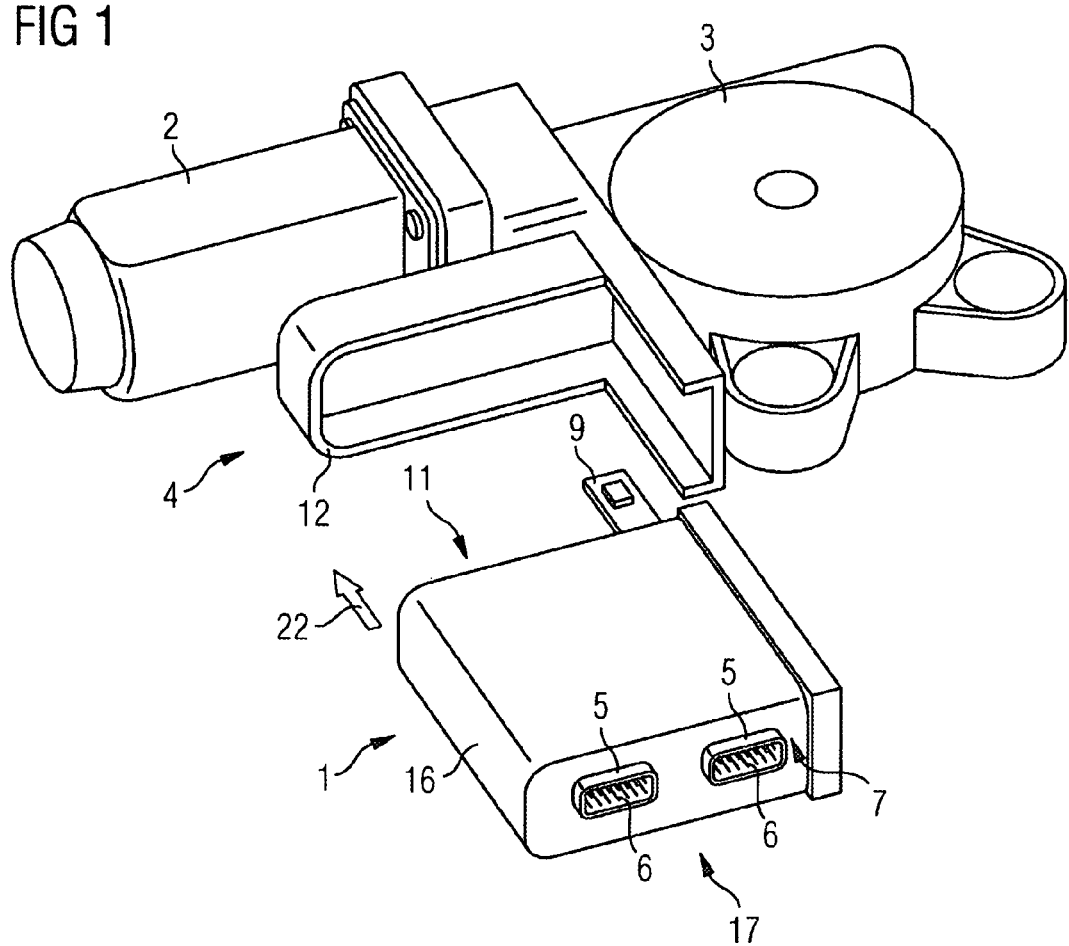
FIG. 1 an exemplary embodiment of the control unit as is used for an electric window lifter drive of a motor vehicle, prior to the connecting with an electromotive drive unit.

FIG. 1 shows a drive unit for an electric window lifter in three-dimensional representation substantially comprising a motor 2 and a gear 3, a control unit 1 and an interface device 4 through which the control unit 1 can be electrically and mechanically connected with the motor-gear housing. For establishing the connection, control unit 1 is plugged in the drawn guide in the direction of the arrow 22 in FIG. 1.

FIG. 2 shows the control unit 1 in a top view. The control unit 1 comprises a housing 16 having the shape of a cuboid cup. The housing 16 is manufactured of a polymer material through injection molding. The housing 16 is open towards a side 11. Opposite to this opening 11 an electric plug-in device 17 is formed on a floor part 10. This plug-in device 17 in the present exemplary embodiment consists of a first and a second connector slot 18; each of these connector slots 18 is formed through a connector collar 5 molded to the outside of the floor part 10. Each connector collar 5 is molded to the housing 16 through injection molding.

The sectional drawing in FIG. 3 shows a circuit board 8 arranged in the interior of the housing 16. This circuit board 8 is plugged into guide strips 23 of a guiding device. On the side of the circuit board 8 located in plug-in position to the plug-in device 18 bores 19 are formed. Angled-off plug contacts 6 are fastened in the bores 19. The plug contacts 6 are formed as contact pins. Fastening on the carrier 8 is performed through pressing-in but can also be performed through soldered. The plug contacts 6 are plugged through plug-through openings 21 (detail X in FIG. 6) in the floor part 10 of the housing 16 with the end facing in plug-in direction. On the end of the circuit board 8 located towards the motor 2 a circuit board lug 9 is formed which carries a Hall sensor which serves to sense the rotary position of the rotor of motor 2.

FIG. 4 shows the control unit in a lateral view with view of the plug-in device 17.

Figure 5:
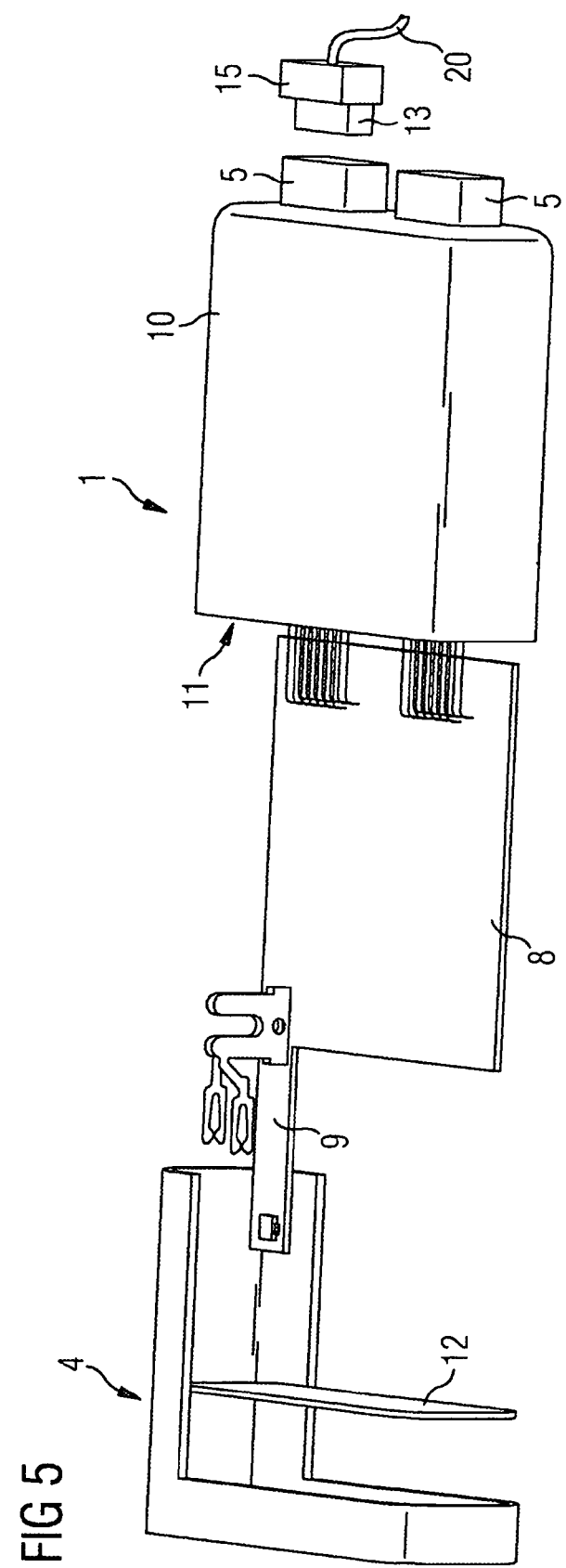
FIG. 5 a drawn-out representation of the control unit according to an embodiment.

FIG. 5 shows the control unit 1 in a drawn-out representation. In FIG. 5 a sealing device is designated with the reference number 12 through which sealing device the housing is closed off waterproof with the mechanical interface device 4. On the connector side sealing is carried out by means of a sealing device 13 which is provided with the connector socket part 15 connected to the cable 20.

Figure 6:
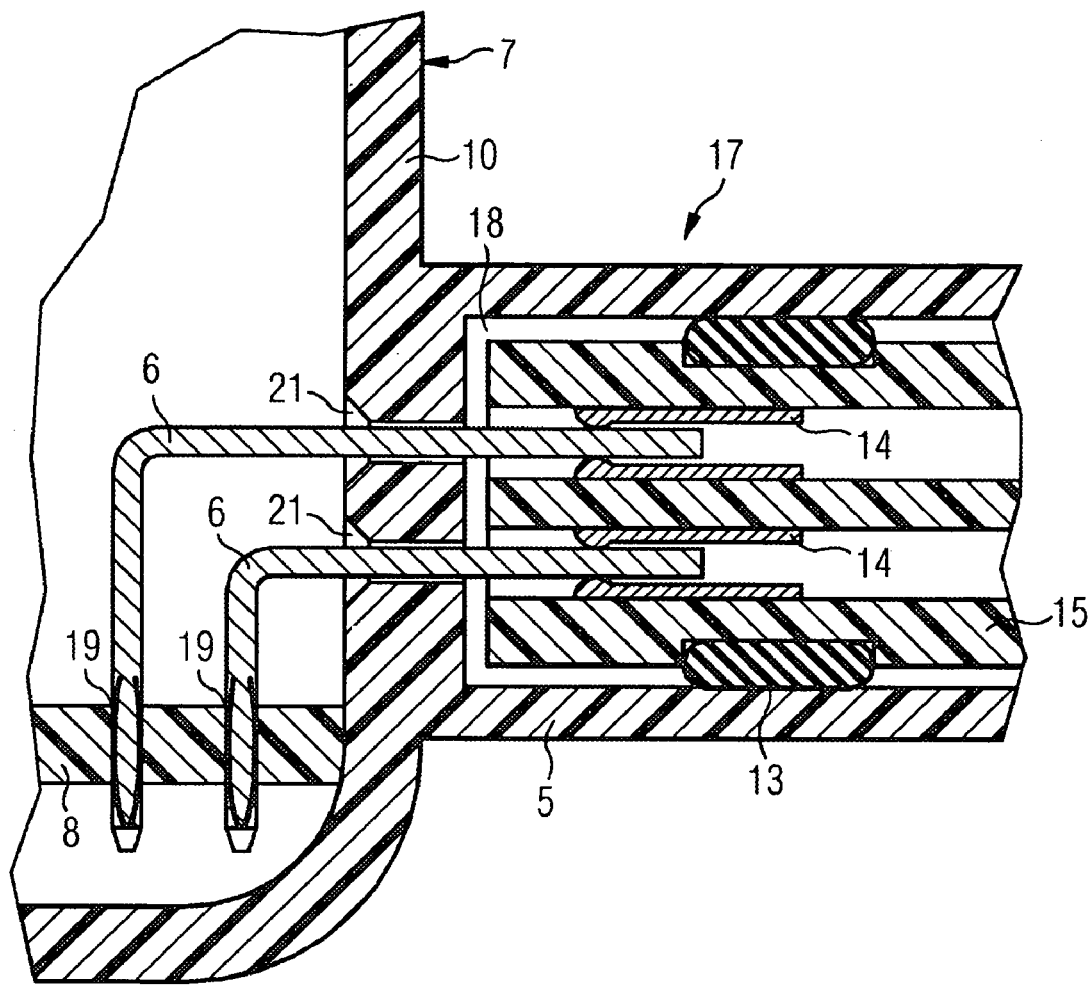
FIG. 6 a detail drawing in the region "Detail X" of FIG. 3.

FIG. 6 shows a "Detail X" according to FIG. 2 in a sectional representation. The contact pins 6 in FIG. 6 are bent by approximately 90°. Vertical end pieces of the contact pins 6 are plugged into the bores 19 of the circuit board 8; in the example shown the connection is performed according to the pressing-in method. The horizontally orientated end pieces of the contact pins 6 are plugged through plug-through openings 21. The plug-through openings 21 seen from the interior of the housing are conical at least in a plug-in region. This facilitates the threading-in of the contact pins 6 when plugging-in the circuit board 8. The contact pins 6 protrude into the connector slot 18 with the end that runs parallel to the circuit board 8. In the torn-off representation of FIG. 6 a plugged-in female connector 15 is drawn in the connector slot 18. Contacting of the individual contact pins 6 with conductors of the cable 20 is performed by means of contact springs 14 which are formed in the female connector 15. Connector-sided sealing is performed by means of an all round silicone seal 13 which is held in a slot of the female connector 15.

SUMMARY OF REFERENCE NUMBERS USED

1 Control unit
2 Motor
3 Gear
4 Interface device
5 Connector collar
6 Contact pins
7 Side of housing
8 Circuit board
9 Circuit board lug
10 Floor part
11 Opening
12 Seal (drive end)
13 Seal (connector end)
14 Contact spring in 15
15 Female connector
16 Housing
17 Plug-in device
18 Connector slot
19 Bore
20 Cable
21 Plug-through opening
22 Arrow
23 Guide strips

What is claimed is:

1. A control unit for controlling an electromotive drive unit, comprising:
a housing that connects to the electromotive drive unit by means of a mechanical interface device,
an opening formed in a first side of the housing facing the electromotive drive unit and configured for receiving a circuit board into the housing,
a guiding device integral with or coupled to the housing for guiding the circuit board into the housing through the opening in the first side of the housing, the guiding device comprising guide strips or slot-shaped clearances which are formed on opposite inner wall faces of the housing and a plug-in device formed on a second side of the housing facing away from the electromotive drive unit, the plug-in device configured for connection with a cable connector external to the housing, wherein contact pins of the plug-in device are arranged in at least one connector slot of the plug-in device and are electrically connected with conductor tracks of the circuit board, wherein the at least one connector slot is arranged on the second side of the housing facing away from the electromotive drive unit and is defined by a connector collar which is formed as one piece with the housing.

2. The device according to claim 1, wherein the housing is formed in the shape of a cuboid cup and comprises a floor part onto which the at least one connector collar is molded.

3. The device according to claim 1, further comprising plug-through openings through which ends of the contact pins orientated parallel to the plane of the circuit board are plugged through.

4. The device according to claim 3, wherein the plug-through openings are conically tapering.

5. The device according to claim 1, wherein the contact pins are formed as 90° angled-off cylindrical contact pins or prismatic contact posts.

6. The device according to claim 5, wherein each plug-through opening defines a conical bore with a clear diameter which is greater than a diameter of the contact pins or a cross sectional diagonal of the contact posts.

7. The device according to claim 5, wherein the contact pins or contact posts are manufactured of bronze.

8. The device according to claim 5, wherein the contact pins or contact posts are fastened to the circuit board by means of a soldered connection or a pressing-in connection.

9. The device according to claim 1, further comprising a sealing device provided proximate the first side of the housing facing the electromotive drive unit.

10. The device according to claim 1, comprising at least two connector collars formed on the second side of the housing facing away from the electromotive drive unit.

11. A method for controlling an electromotive drive unit, comprising:

receiving a circuit board through an opening formed in a first side of a housing that faces the electromotive drive unit, guiding the circuit board through the opening and into the housing a guiding device integral with or coupled to the housing, the guiding device comprising guide strips or slot-shaped clearances which are formed on opposite inner wall faces of the housing connecting the housing to the electromotive drive unit by means of a mechanical interface device, plugging a cable connector into a plug-in device formed on a second side of the housing facing away from the electromotive drive unit, wherein contact pins of the plug-in device are arranged in at least one connector slot of the plug-in device and are electrically connected with conductor tracks of the circuit board received in the interior of the housing, and wherein the at least one connector slot is arranged on the second side of the housing facing away from the electromotive drive unit and is defined by a connector collar which is formed as one piece with the housing.

12. The method according to claim 11, further comprising the step of forming the housing in the shape of a cuboid cup and molding at least one connector collar onto the housing.

13. The method according to claim 11, further comprising the step of providing plug-through openings through which ends of the contact pins orientated parallel to the plane are plugged through.

14. The method according to claim 13, further comprising the step of forming the plug-through openings as conically tapering openings.

15. The method according to claim 11, further comprising the step of forming the contact pins as 90° angled-off cylindrical contact pins or prismatic contact posts.

16. The method according to claim 15, further comprising the step of forming each plug-through opening as a conical bore with a clear diameter which is greater than a diameter of the contact pins or a cross sectional diagonal of the contact posts.

17. The method according to claim 15, further comprising the step of manufacturing the contact pins or contact posts of bronze.

18. The method according to claim 15, further comprising the step of fastening the contact pins or contact posts to the circuit board by means of a soldered connection or a pressing-in connection.

* * * * *